US007881480B2

(12) United States Patent
Buck et al.

(10) Patent No.: US 7,881,480 B2
(45) Date of Patent: Feb. 1, 2011

(54) SYSTEM FOR DETECTING AND REDUCING NOISE VIA A MICROPHONE ARRAY

(75) Inventors: Markus Buck, Biberach (DE); Tim Haulick, Blaubeuren (DE)

(73) Assignee: Nuance Communications, Inc., Burlington, MA (US)

( * ) Notice: Subject to any disclaimer, the term of this patent is extended or adjusted under 35 U.S.C. 154(b) by 1630 days.

(21) Appl. No.: 11/083,190

(22) Filed: Mar. 17, 2005

(65) Prior Publication Data

US 2005/0213778 A1 Sep. 29, 2005

(30) Foreign Application Priority Data

Mar. 17, 2004 (EP) .................................. 04006445

(51) Int. Cl.
*H04B 15/00* (2006.01)
*H03B 29/00* (2006.01)
*H04R 3/00* (2006.01)

(52) U.S. Cl. .................... 381/94.1; 381/94.2; 381/94.3; 381/71.1; 381/71.7; 381/92; 381/111; 381/122

(58) Field of Classification Search ................ 381/71.7, 381/94.1–94.3, 92, 71.1, 111, 122; 704/226, 704/233; 379/406.08
See application file for complete search history.

(56) References Cited

U.S. PATENT DOCUMENTS

| | | | | |
|---|---|---|---|---|
| 4,912,767 | A | | 3/1990 | Chang |
| 5,568,558 | A | | 10/1996 | Ramm et al. |
| 5,848,163 | A | | 12/1998 | Gopalakrishnan |
| 6,154,552 | A | * | 11/2000 | Koroljow et al. ............ 381/313 |
| 6,243,322 | B1 | | 6/2001 | Zakarauskas |
| 6,625,587 | B1 | | 9/2003 | Erten et al. |
| 6,691,073 | B1 | | 2/2004 | Erten et al. |
| 6,754,623 | B2 | | 6/2004 | Deligne et al. |
| 7,068,801 | B1 | * | 6/2006 | Stinson et al. .............. 381/160 |

(Continued)

FOREIGN PATENT DOCUMENTS

| | | |
|---|---|---|
| JP | 2003140686 | 5/2003 |

(Continued)

OTHER PUBLICATIONS

Mahmoudi, Djamila and Drygajlo, Andrzej. Combined Vector and Coherence Filtering in Wavelet Domain for Microphone Array Speech Enhancement. Proceedings of the 1998 IEEE International Conference on Acoustics, Speech and Signal Processing, Seattle, Washington, May 12-15, 1998, pp. 385-388 (p. 4).*

(Continued)

*Primary Examiner*—Devona E Faulk
(74) *Attorney, Agent, or Firm*—Sunstein Kann Murphy & Timbers LLP

(57) ABSTRACT

A system for detecting noise in a signal received by a microphone array and a method for detecting noise in a signal received by a microphone array is disclosed. The system also provides for the reduction of noise in a signal received by a microphone array and a method for reducing noise in a signal received by a microphone array. The signal to noise ratio in handsfree systems may be improved, particularly in handsfree systems present in a vehicular environment.

6 Claims, 3 Drawing Sheets

U.S. PATENT DOCUMENTS 7,142,677 B2 11/2006 Gonopolskiy et al.
7,274,794 B1 * 9/2007 Rasmussen .................. 381/92
7,630,502 B2 * 12/2009 Beaucoup et al. ............. 381/92
2003/0061032 A1 3/2003 Gonopolskiy

FOREIGN PATENT DOCUMENTS

WO WO 01-76319 A2 10/2001

OTHER PUBLICATIONS

Mahmoudi, Djamila and Drygajlo, Andrzej. Combined Vector and Coherence Filtering in Wavelet Domain for Microphone Array Speech Enhancement. Proceedings of the 1998 IEEE International Conference on Acoustics, Speech Processing, Seattle, Washington, May 12-15, 1998, pp. 385-388.*

Mahmoudi, Djamila and Drygajo, Andzej. Combined Vector and Cohernece Filtering in Wavelet Domain for Microphone Array Speech Enhancement. Proceedings of the 1998 IEEE International Conference on Acoustics, Speech Processing. Seattle, Washington, May 12-15, 1998, pp. 385-388.*

Zeira. Interpolated Array Minimum Variance Beamforming for Correlated Interference Rejection. IEEE 1996, pp. 3165-3168.*

Le Bouquin, et al. "Using the coherence function for noise reduction" IEE Proceedings-I, vol. 139, Jun. 1992, pp. 276-280. (5 pgs).

"An Alternative Approach to Linearly Constrained Adaptive Beamforming," by Lloyd J. Griffiths and Charles W. Jim, *IEEE Transactions on Antennas and Propagation*, vol. AP-30, No. 1, Jan. 1982, pp. 27-34 (8 pages).

"Combined Wiener and Coherence Filtering in Wavelet Domain for Microphone Array Speech Enhancement," by Djamila Mahmoudi and Andrzej Drygajlo, proceedings of the 1998 IEEE International Conference on Acoustics, Speech and Signal Processing, Seattle, Washington, May 12-15, 1998, pp. 385-388 (4 pages).

"Measured Performance of a Large-Aperture Microphone Array System," by Harvey F. Silverman, William R. Patterson III, and Joshua Sachar, Aug. 11, 1999, LEMS, Division of Engineering, Brown University, Providence, Rhode Island, pp. 1-16 (19 pages).

"Microphone Array Systems for Hands-Free Telecommunication," by Gary W. Elko, Acoustics Research Department, Bell Labs, Lucent Technologies, Murray Hill, NJ, received Feb. 2, 1996; revised Sep. 3, 1996, pp. 229-240 (12 pages).

"Optimal Filtering and Speech Recognition with Microphone Arrays," by John E. Adcock, a dissertation submitted in partial fulfillment of the requirements for the degree of Doctor of Philosophy in the Division of Engineering at Brown University, Providence, Rhode Island, May 2001, pp. 1-91 (101 pages).

Partial European Patent Office Search Report regarding Application No. EP 04 00 6445, dated Sep. 2, 2004 (2 pages).

European Patent Office Search Report regarding Application No. EP 04 00 6445, dated Dec. 22, 2004, 2 pages.

Saruwatari, Hiroshi et al., "Speech Enhacement Using Nonlinear Microphone Array with Noise Adaptive Complementary Beamforming," XP-001072070, 2000 IEEE International Conference on Acoustics, Speech, and Signal Processing Proceedings (ICASSP), New York, NY, Jun. 5-9, 2000, vol. 2 of 6, pp. 1049-1052 (4 pages).

* cited by examiner

SYSTEM FOR DETECTING AND REDUCING NOISE VIA A MICROPHONE ARRAY

PRIORITY CLAIM

This application claims the benefit of European Patent Application No. 04006445.3, filed Mar. 17, 2004. The disclosure of the above application is incorporated in its entirely herein by reference.

BACKGROUND OF THE INVENTION

1. Technical Field

This application is directed to a system for detecting noise, particularly uncorrelated noise, via a microphone array and to a system for reducing noise, particularly uncorrelated noise, received by a microphone array connected to a beamformer.

2. Related Art

In different areas, handsfree systems are used for many different applications. In particular, handsfree telephone systems and speech control systems are getting more and more common for vehicles. This may be due to a perceived increase in comfort and safety that is obtained when using handsfree systems. Particularly in the case of vehicular applications, one or several microphones can be mounted in the vehicular cabin. Alternatively, a user can be provided with a corresponding headset.

However, in handsfree systems, the signal to noise ratio (SNR) usually is deteriorated (i.e., reduced) in comparison to a handset system. This is mainly due to the distance between the microphone and the speaker, and the resulting low signal level at the microphone. Furthermore, a high ambient noise level is often present, requiring utilization of methods for noise reduction. These methods are based on a processing of the signals received by the microphones. One channel and multi-channel noise reduction methods may be distinguished depending on the number of microphones.

Beamforming methods are used for background noise reduction, particularly in the field of vehicular handsfree systems, but also in other applications. A beamformer processes signals emanating from a microphone array to obtain a combined signal in such a way that signal components coming from a direction different from a predetermined wanted signal direction are suppressed. Microphone arrays, unlike conventional directional microphones, are electronically steerable which gives them the ability to acquire a high-quality signal or signals from a desired direction or directions while attenuating off-axis noise or interference.

Beamforming, therefore, may provide a specific directivity pattern for a microphone array. In the case of, for example, delay-and-sum beamforming (DSBF), beamforming encompasses delay compensation and summing of the signals. Due to spatial filtering obtained by a microphone array with a corresponding beamformer, it is often possible to improve the SNR. However, achieving a significant improvement in SNR with simple DSBF requires an impractical number of microphones, even under idealized noise conditions. Another beamformer type is the adaptive beamformer. Traditional adaptive beamformers optimize a set of channel filters under some set of constraints. These techniques do well in narrowband, far-field applications and where the signal of interest generally has stationary statistics. However, traditional adaptive beamformers are not necessarily as well suited for use in speech applications where, for example, the signal of interest has a wide bandwith, the signal of interest is non-stationary, interfering signals also have a wide bandwith, interfering signals may be spatially distributed, or interfering signals are non-stationary. A particular adaptive array is the generalized sidelobe canceler (GSC). The GSC uses an adaptive array structure to measure a noise-only signal which is then canceled from the beamformer output. However, obtaining a noise measurement that is free from signal leakage, especially in reverberant environments, is generally where the difficulty lies in implementing a robust and effective GSC. An example of a beamformer with a GSC structure is described in L. J. Griffiths & C. W. Jim, *An Alternative Approach to Linearly Constrained Adaptive Beamforming*, in IEEE Transactions on Antennas and Propagation, 1982 pp. 27-34.

In addition to ambient noise, the signal quality of a wanted signal can also be reduced due to wind perturbation. These perturbations arise if wind hits the microphone enclosure. The wind pressure and air turbulences may deviate the membrane of the microphone considerably, resulting in strong pulse-like disturbances, which may be known as wind noise or Popp noise. In vehicles, this problem may arise if the fan is switched on or in the case of the open top of a cabriolet.

For reduction of these perturbations, corresponding microphones are usually provided with a wind shield (also known as a “Popp shield”). The wind shield reduces the wind speed and, thus, also the wind noise without considerably affecting the signal quality. However, the effectiveness of such a wind shield depends on its size and, hence, increases the overall size of the microphone. A large microphone is often undesired because of design reasons and lack of space. Because of these and other reasons, many microphones are not equipped with an adequate wind shield, thereby resulting in poor speech quality for a handsfree device and low speech recognition rate of a speech control system.

Therefore, a need exists for a system for detecting and reducing noise and in particular uncorrelated noise such as wind noise at microphones.

SUMMARY

This application provides a system for detecting noise, particularly uncorrelated noise, via a microphone array. The system also provides a method for detecting noise, particularly uncorrelated noise, via a microphone array. The application also provides a system for reducing noise, particularly uncorrelated noise, received by a microphone array connected to a beamformer. The system also provides a method for reducing noise, particularly uncorrelated noise, received by a microphone array connected to a beamformer. The application further provides for receiving microphone signals emanating from microphones of a microphone array and decomposing each microphone signal into frequency sub-band signals. A time dependent measure based on the frequency sub-band signals may be determined for each microphone signal. A time dependent criterion function may be determined as a predetermined statistical function of the time dependent measures. The criterion function may be evaluated according to a predetermined criterion to detect noise.

The application also provides a system for reducing noise in a microphone signal received by a microphone array, where a beamformer is configured to receive a microphone signal from the microphone array. The beamformer outputs a beamformer output signal, which may be replaced with a modified beamformer output signal.

The application also provides for a computer program product with a computer useable medium having a computer readable code embodied in the medium for detecting and reducing uncorrelated noise. The computer readable program code in the computer program product further may include computer readable program code for causing the computer to detect uncorrelated noise, as well as computer readable program code for causing the computer to reduce uncorrelated noise.

The application further provides for a program storage device readable by a machine, tangibly embodying a program of instructions executable by the machine to detect and reduce noise via a microphone array. The storage device may include instruction for detecting noise via a microphone array and reducing the detected noise. The detection of noise may include receiving at least one signal from a microphone array, decomposing the signal into at least one frequency sub-band signal, determining a time dependent measure for the signal based on the frequency sub-band signal, determining a time dependent criterion function and evaluating the criterion function according to a predetermined criterion. The reduction of noise may include connecting a beamformer to the microphone array, where the beamformer is configured to receive a microphone signal from the microphone array and output a beamformer output signal, and further replacing the beamformer output signal with a modified beamformer output signal.

Other systems, methods, features and advantages of the invention will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The invention can be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION OF THE PREFERRED EMBODIMENTS

Figure 1:
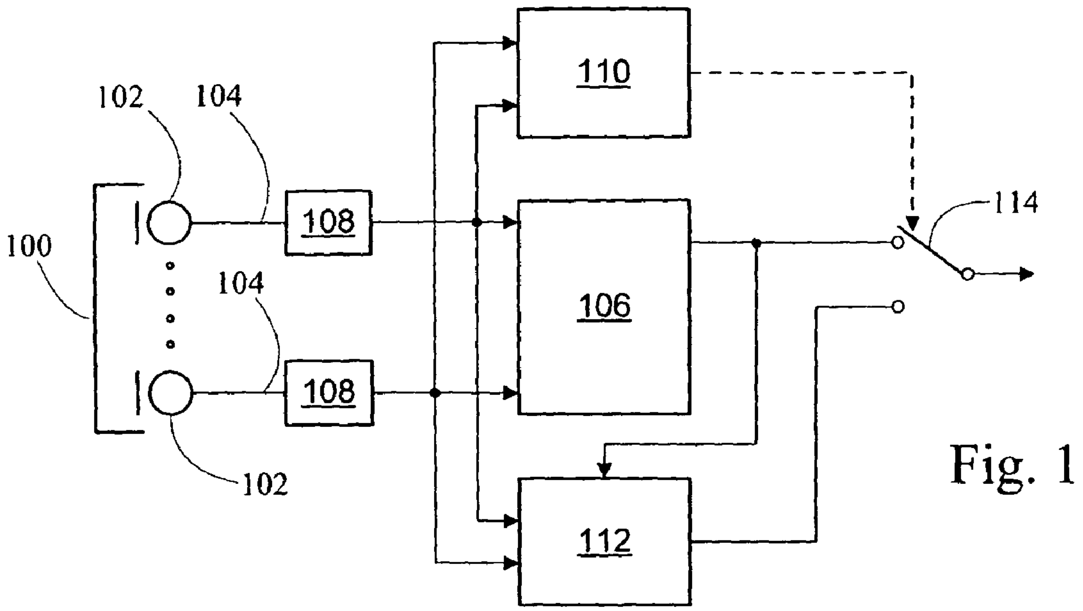
FIG. 1 illustrates an example of a system for reducing noise in a signal.

In FIG. 1, an example of a system for reducing or suppressing noise is shown. A microphone array 100 with at least two microphones 102 is shown. While a particular arrangement of the microphones 102 in the microphone array 100 is shown, different arrangements of the microphones 102 are possible. For example, the microphones 102 may be placed in a row, where each microphone 102 has a predetermined distance to its neighbors. For example, the distance between microphones 102 may be approximately 5 cm. Depending on the application, the microphone array 100 may be mounted at a suitable place. For example, in the case of a vehicle or a vehicle cabin, the microphone array 100 may be mounted in the driving mirror near the roof of the vehicle, or in the headrest. In this application, the term vehicle includes an automobile, motorcycle, spaceship, airplane and/or train, or any other means of conventional or unconventional transportation.

Microphone signals 104 emanating from the microphones 102 are sent to a beamformer 106. Prior to reaching the beamformer 106, the signals 104 may pass signal processing elements 108 for pre-processing of the signals. The signal processing elements 108 may be, for example, filters such as high pass or low pass filters and the like. The beamformer 106 processes the signals 104 in such a way as to obtain a single output signal ($Y_l(k)$) with an improved signal to noise ratio. The beamformer 106 may be a delay-and-sum beamformer (DSBF) in which delay compensation for the different microphones 102 is performed followed by summing the signals to obtain the output signal. Alternatively, the beamformer 106 may use adaptive Wiener-filters, or the beamformer 106 may have a GSC structure.

The microphone signals 104 also may be sent to a noise detector 110. Prior to reaching the noise detector 110, the signals 104 may pass signal processing elements 108 for pre-processing of the signals. The signals 104 also may be sent to a noise reducer 112. Prior to reaching the noise reducer 112, the signals 104 may pass signal processing elements 108 for pre-processing of the signals.

In the noise detector 110, the microphone signals 104 may be processed in order to determine whether noise, particularly uncorrelated noise such as wind noise, is present. The process of detection will be explained in more detail with reference to FIG. 2, below. Depending on the result of the noise detection, the noise reduction or suppression performed by the noise reducer 112 may be activated. This is illustrated schematically by a switch 114. If no noise is detected, for example, for a predetermined time interval, the output signal $Y_l(k)$ of the beamformer 106 is not modified. If noise is detected, for example, for a predetermined time threshold, a noise reduction by way of signal modification is activated. Based on the beamformer 106 output signal $Y_l(k)$ and the microphone signals 104, a modified output signal, $Y_l^{mod}(k)$, is generated, which will be described in more detail below in reference to FIG. 3.

Alternatively, the processing and modifying of the signal 104 also may be performed without requiring detection of noise. For example, the noise detector 110 may be omitted and the output signal $Y_l(k)$ of the beamformer 106 may always be passed to the noise reducer 112.

Figure 2:
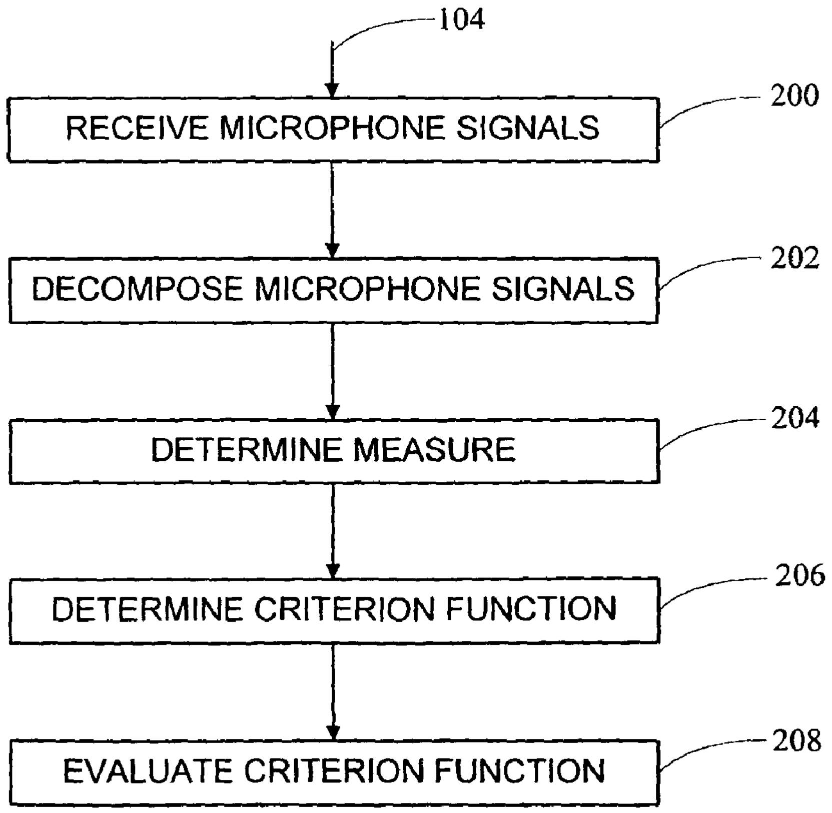
FIG. 2 is a flow diagram illustrating an example of a system for detecting noise in a signal.

In FIG. 2, a flow diagram is shown illustrating an example of a method for detecting noise in a signal. In step 200 of the method, signals 104 from M microphones 102 are received. In step 202, each microphone signal 104 may be decomposed into frequency sub-band signals. For this step, the signals 104 may be digitized to obtain digitized microphone signals $x_m(n)$, $m \in \{1 \ldots M\}$. Before digitizing or after digitizing and before the actual decomposition, the microphone signals 104 may be filtered. Complex-valued sub-band signals $X_{m,l}(k)$ may be obtained via a short time discrete Fourier transform (DFT), via discrete wavelet transform, or via filter banks, where l denotes the frequency index or the sub-band index. Short time DFT is described in K. D. Kammeyer and K. Kroschel, *Digitale Signalverarbeitung,* 4th ed. 1998 (Teubner (Stuttgart)), wavelets in T. E. Quatieri, *Discrete-time Speech Signal Processing—Principle and Practice*, (Prentice Hall 2002 (Upper Saddle River, N.J.)), and filter banks in N. Fliege, *Multiraten-Signalverarbeitung: Theorie und Anwendungen,* 1993 (Teubner (Stuttgart)). Thus, depending on further processing of the signals, the most appropriate method can be selected. The sub-band signal may be sub-sampled by a factor R, n=Rk. In this way, the amount of data to be further processed can be reduced considerably.

For detection of uncorrelated noise, a time-dependent measure $Q_m(k)$ may be derived 204 from the corresponding sub-band signals $X_{m,l}(k)$ for each microphone. Each time-dependent measure may be determined as a predetermined function of the signal power of one or several sub-band signals of the corresponding microphone. The signal power of the sub-band signal of a microphone (or the signal power values of different sub-band signals) is a suitable quantity for detecting the presence of noise. In particular, it is assumed that uncorrelated noise such as wind noise occurs mainly at low frequencies. The detection of wind disturbances may be based on a statistical evaluation of these measures. An example for such a measure is the current signal power summed over several sub-bands:

$$Q_m(k) = \sum_{l=l1}^{l_2} |X_{m,l}(k)|^2$$

with $X_{m,l}(k)$ denoting the sub-band signals, $m \in \{1, \ldots, M\}$ being the microphone index, $l \in \{1, \ldots, L\}$ being the sub-band index, k being the time variable, and $l_1, l_2 \in \{1, \ldots, L\}$, $l_1 < l_2$. In this case, the time-dependent measure is given by the signal power summed over several sub-bands within the limits $l_1 \mu l_2$ at a specific time k. It does not matter, however, whether the sub-bands are indexed by natural numbers 1, K, L or by corresponding frequency values (e.g., in Hz).

There are different possibilities for the statistical evaluation. A corresponding criterion function C(k) may be determined in step 206. The criterion function provides an efficient method to detect noise. For example, the criterion function can be the variance:

$$\sigma^2(k) = \frac{1}{M-1} \sum_{m=1}^{M} (Q_m(k) - \overline{Q}(k))^2,$$

where $\overline{Q}(k)$ denotes the mean of the signal powers over the microphones, further expressed as:

$$\overline{Q}(k) = \frac{1}{M} \sum_{m=1}^{M} Q_m(k).$$

Alternatively, it is also possible to take the ratio of the minimum and the maximum of the time-dependent measures as a criterion function instead of the variance:

$$r(k) = \frac{\min_m Q_m(k)}{\max_m Q_m(k)}.$$

In step 208, the criterion function may be evaluated according to a predetermined criterion. A predetermined criterion for evaluation of the criterion function can be given the threshold value S. If the criterion function $\sigma^2(k)$ or r(k) takes a larger value than this threshold, it is decided that noise disturbances are present.

Alternatively, instead of directly taking the measures given above for the criterion function, it is also possible to take the logarithm of the measures first. This has the advantage that the resulting criterion shows a smaller dependence on the saturation of the microphone signals. For example, a conversion into dB values can be performed:

$$Q_{dB,m}(k) = 10 \cdot \log_{10} Q_m(k).$$

Then, $Q_{dB,m}(k)$ is inserted in the above equations for the variance or the quotient in order to obtain a corresponding criterion function. It is assumed that the variance or the quotient as given above reach lower values in the case of sound propagation in resting propagation media whereas wind disturbances result in higher values that may also show high temporal values.

Figure 3:
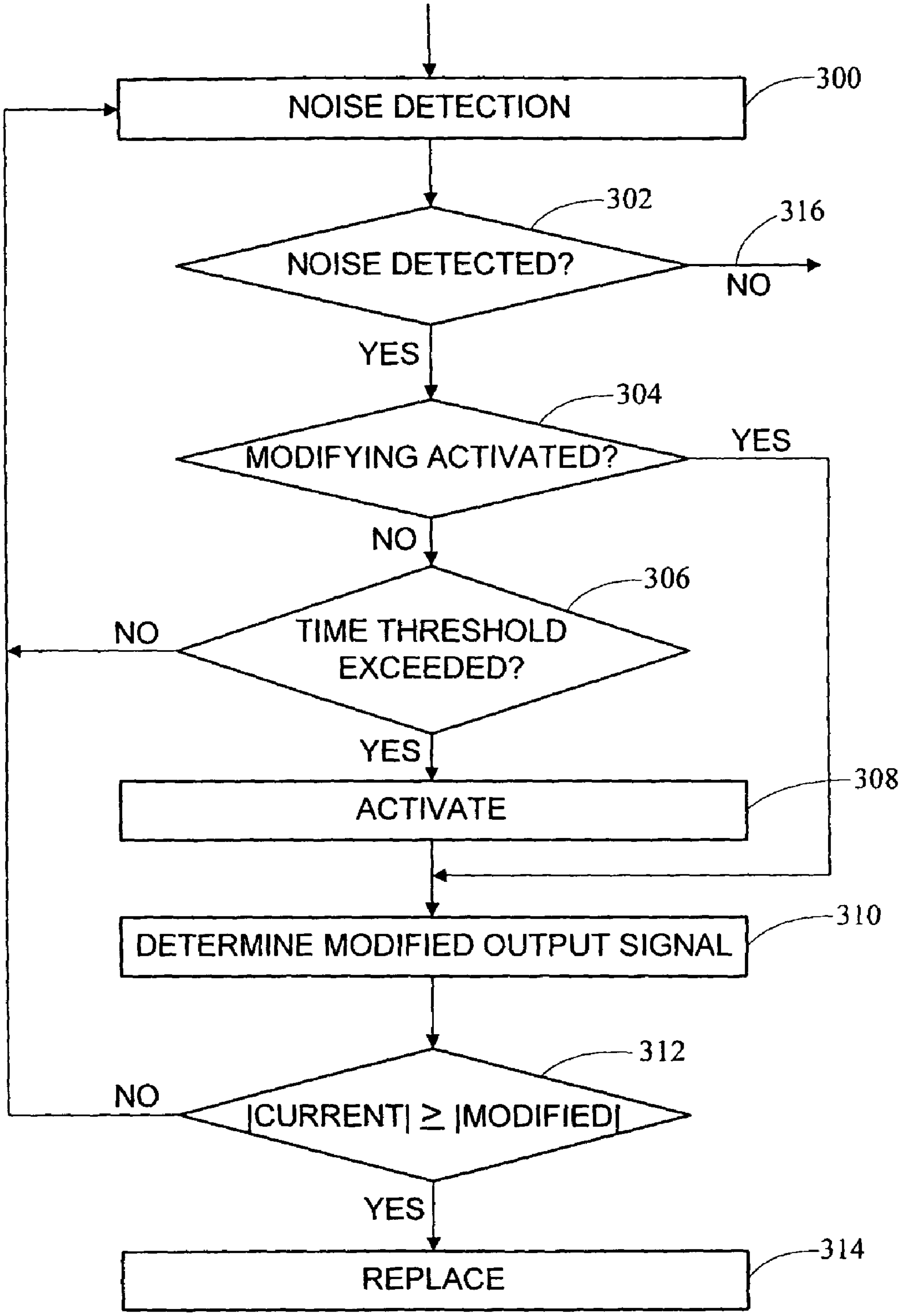
FIG. 3 is a flow diagram illustrating an example of a system for reducing noise in a signal.

In FIG. 3, a flow diagram is shown as an example of a system for reducing uncorrelated noise in a signal received by a microphone array. This method improves the SNR (due to the processing of the current output signal to reduce noise, particularly uncorrelated noise such as wind noise) when using handsfree systems without requiring large windshields for the microphones 102. This method is also useful and efficient for suppression of impact sound. This system corresponds to the system shown in FIG. 1 where a beamformer 106 is connected to a microphone array 100 that receives at least one signal 104. In step 300, a noise detection method—as previously explained in reference to FIG. 2—is performed. In step 302, the system may determine whether noise has in fact been detected. If noise is detected, whether modifying of the beamformer output signal $Y_l(k)$ is already activated 304 is determined. This system will be described in more detail below. If the determination is that modifying is activated, then noise suppression in addition to the beamformer may already be occurring.

If the beamformer output signal $Y_l(k)$ is not yet modified, it may then be determined whether the noise was already detected for a predetermined threshold 306. The predetermined time threshold may be set to zero. However, if a non-vanishing time threshold is given but not yet exceeded, the system may return to step 300. If step 306 indicates that noise was detected for the predetermined time interval, or alternatively, if no threshold was given at all, modifying the current beamformer output signal $Y_l(k)$ may be activated 308.

A modified output signal $Y_l^{mod}(k)$ is determined for replacement of the current beamformer output signal 310 $Y_l(k)$. In some embodiments, the phase of the modified beamformer output signal is chosen to be equal to the phase of the beamformer output signal. In some embodiments, for example, the modified output signal, $Y_l^{mod}(k)$, can be given by:

$$Y_l^{mod}(k) = Y_l(k) \cdot \frac{\min_m \{|X_{m,l}(k)|\}}{|Y_l(k)|}$$

Here, the phase of the output signal $Y_l(k)$ is maintained whereas the magnitude (or the modulus) of the current beamformer output signal is replaced by the minimum of the magnitudes of the microphone signals. The minimum in the above equation for the modified output signal need not be determined only of the magnitudes of the microphones signals. Other signals may be taken into account when determining the minimum. For example, the magnitude of the current beamformer output signal can be replaced by the minimum of the magnitudes of the microphone signals and the magnitude of the output signal of a DSBF, for example:

$$\left| \frac{1}{M} \sum_{m=1}^{M} X_{m,l}(k) \right|.$$

In step 312, the magnitude of the current beamformer output signal is compared with the magnitude of the modified output signal. If the modified output signal is larger, no replacement of the current beamformer output signal should take place. However, if the beamformer output signal is larger than or equal to the magnitude of the modified output signal, the system proceeds, where the beamformer output signal is actually replaced by the modified output signal as given 314, for example, in the above equation.

If at least one of the microphones 102 remains undisturbed, wind noise may be suppressed effectively by the above-described methods. If all microphones 102 are disturbed, there is also an improvement of the output signal $Y_l(k)$. In any event, further processing of the output signal for additional noise suppression is possible. Instead of taking the minimum value as described above, it is also possible to use other linear or non-linear functions of the magnitudes of the microphone signals for replacement of the beamformer output signal $Y_l(k)$. For example, the median or the arithmetic or geometric mean can be used. The arithmetic mean may correspond to the output of a DSBF.

Alternatively, it is possible to keep the signal modification always activated and to omit steps 300, 302, 304, 306 and 308. This means that for each beamformer output signal $Y_l(k)$, a modified signal would be determined in step 310, followed by steps 312 and 314.

Figure 4:
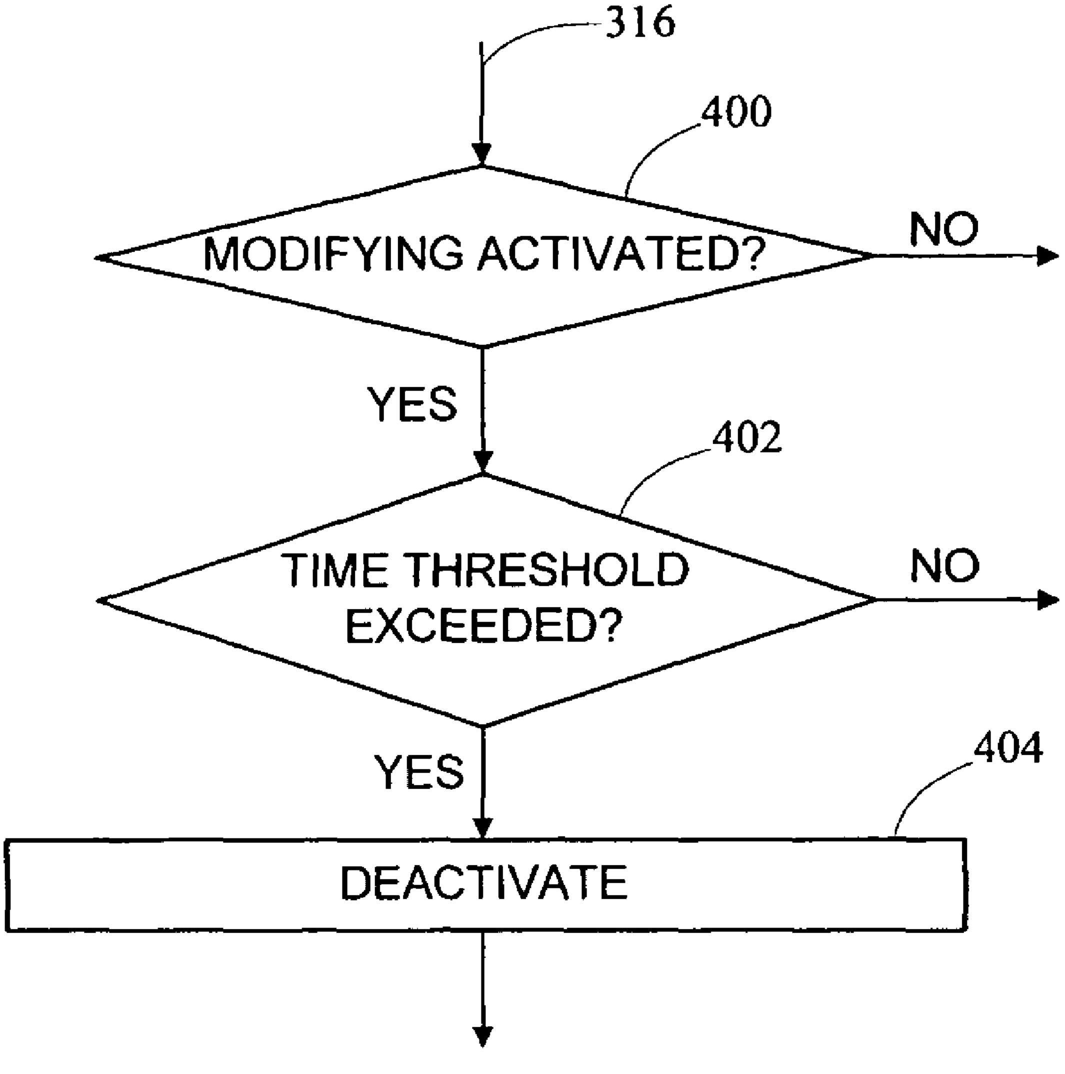
FIG. 4 is a flow diagram illustrating an example of deactivation of modifying the output signal.

FIG. 4 illustrates an example where no noise is detected in step 302 of FIG. 3 and the process proceeds following step 316. It is determined 400 whether modifying of the beamformer output signal is currently activated. If not, the system continues with the noise detection. However, if modifying of the output signal and noise suppression is activated, it is determined 402 whether no noise was detected for a predetermined time threshold $\tau_H$. If the threshold is not exceeded, the system continues with the noise detection. However, if no noise was detected for the predetermined time interval, modifying the beamformer output signal is deactivated. Such a deactivation can make the system more efficient.

The above-described noise suppression is an addition to a beamformer. The actual beamformer processing of the microphone signals 104 is not amended which means that the method can be combined with different types of beamformers.

The noise suppression method is particularly well suited to vehicular applications. In the case of a automobile, one can use a microphone array consisting of M=4 microphones in a linear arrangement in which two neighboring microphones have a distance of 5 cm, respectively. The beamformer 106 may be an adaptive beamformer with GSC structure. In such a case, for example, the parameters that may be chosen may be as follows: the sampling frequency of signals ($f_A$) may be 11025 Hz; the DFT length ($N_{FFT}$) may be 256; the subsampling (R) may be 64; the measure of output signal, expressed in dB may be $$Q_{dB,m}(k) = 10\cdot\log_{10}\sum_{l=l_1}^{l_2}|X_{m,l}(k)|^2;$$

the summation limits, $l_1$ and $l_2$, may be 0 Hz and 250 Hz, respectively; the criterion function may be defined as $$\sigma^2(k) = \frac{1}{M-1}\sum_{m=1}^{M}(Q_{dB,m}(k) - \overline{Q_{dB}}(k))^2;$$

with the detection threshold (S) being 4; and the deactivation threshold ($\tau_H$) being 2.9 seconds.

The invention also provides a computer program product comprising one or more computer readable media having computer executable instructions for performing the steps of at least one of the above-described methods.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

What is claimed is:

1. A method for reducing noise in a microphone signal received by a microphone array, comprising:

detecting noise via a microphone array;

reducing the detected noise by performing the following steps:

connecting a beamformer to a microphone array, where the beamformer is configured to receive a microphone signal from the microphone array and output a beamformer output signal; and replacing the beamformer output signal with a modified beamformer output signal;

where the phase of the modified beamformer output signal is maintained to be equal to the phase of the beamformer output signal;

where the replacing step is only performed if the magnitude of at least one sub-band of the beamformer output signal is larger than or equal to the magnitude of at least one sub-band of the modified beamformer output signal.

2. The method of claim 1 where the magnitude of the modified beamformer output signal is chosen to be a function of the magnitude of the microphone signal.

3. The method of claim 1, where the beamformer is an adaptive beamformer.

4. A system for detecting and reducing noise via a microphone array, comprising:

a microphone array comprised of at least two microphones;

signal processing means for processing at least one signal from the microphone array;

noise detection means for detecting noise in the at least one signal from the microphone array;

noise reducing means for reducing noise in the at least one signal from the microphone array;

a beamformer; and a switch;

wherein detecting noise includes evaluating a criterion function according to a predetermined criterion, the criterion function being one of:

a) a ratio of a minimum value of a time dependent measure and a maximum value of the time dependent measure; and b) a variance of the time dependent measure, the time dependent measure being determined for a frequency sub-band signal of the at least one signal; and wherein reducing noise includes replacing an output signal of the beamformer with a modified beamformer output signal, where the phase of the modified beamformer output signal is maintained to be equal to the phase of the output signal of the beamformer, and wherein the replacing is only performed if the magnitude of at least one sub-band of the beamformer output signal is larger than or equal to the magnitude of at least one sub-band of the modified beamformer output signal.

5. A non-transitory program storage device readable by a machine, tangibly embodying a program of instructions executable by the machine to detect and reduce uncorrelated noise, comprising:

causing the computer to detect uncorrelated noise; and causing the computer to reduce uncorrelated noise; wherein causing the computer to detect uncorrelated noise includes evaluating a criterion function according to a predetermined criterion, the criterion function being one of:

a) a ratio of a minimum value of a time dependent measure and a maximum value of the time dependent measure; and b) a variance of the time dependent measure, the time dependent measure being determined for a frequency sub-band signal of a signal from a microphone array; and wherein causing the computer to reduce uncorrelated noise includes replacing an output signal of the beamformer with a modified beamformer output signal, where the phase of the modified beamformer output signal is maintained to be equal to the phase of the output signal of the beamformer, and wherein the replacing is only performed if the magnitude of at least one sub-band of the beamformer output signal is larger than or equal to the magnitude of at least one-sub-band of the modified beamformer output signal.

6. A non-transitory program storage device readable by a machine, tangibly embodying a program of instructions executable by the machine to detect and reduce noise via a microphone array, comprising:

detecting noise via a microphone array; and reducing the detected noise; where the step of detecting noise further comprises receiving at least one signal from a microphone array; decomposing the signal into at least one frequency sub-band signal; determining a time dependent measure for the signal based on the frequency sub-band signal; determining a time dependent criterion function; and evaluating the criterion function according to a predetermined criterion;

wherein the criterion function is one of:

a) a ratio of a minimum value of the time dependent measure and a maximum value of the time dependent measure; and b) a variance of the time dependent measure; and where reducing the detected noise further comprises connecting a beamformer to the microphone array, where the beamformer is configured to receive a microphone signal from the microphone array and output a beamformer output signal; and replacing the beamformer output signal with a modified beamformer output signal where the phase of the modified beamformer output signal is maintained to be equal to the phase of the output signal of the beamformer, and wherein the replacing is only performed if the magnitude of at least one sub-band of the beamformer output signal is larger than or equal to the magnitude of at least one sub-band of the modified beamformer output signal.

* * * * *